United States Patent [19]
Losinski

[11] Patent Number: 5,861,703
[45] Date of Patent: Jan. 19, 1999

[54] LOW-PROFILE AXIAL-FLOW SINGLE-BLADE PIEZOELECTRIC FAN

[75] Inventor: Armand Losinski, Albuquerque, N. Mex.

[73] Assignee: Motorola Inc., Schaumburg, Ill.

[21] Appl. No.: 866,433

[22] Filed: May 30, 1997

[51] Int. Cl.[6] .................................................. H01L 41/08
[52] U.S. Cl. ........................ 310/330; 310/331; 310/332; 417/413.2
[58] Field of Search .................................. 310/330–332; 417/413.2; 416/81; 165/84

[56] References Cited

U.S. PATENT DOCUMENTS

| | | | |
|---|---|---|---|
| 4,498,851 | 2/1985 | Kolm et a. | 417/322 |
| 4,595,338 | 6/1986 | Kolm et al. | 416/81 |
| 4,751,713 | 6/1988 | Affleck | 372/59 |
| 4,753,579 | 6/1988 | Murphy | 417/410.2 |
| 4,780,062 | 10/1988 | Yamada et al. | 417/322 |
| 4,834,619 | 5/1989 | Walton | 417/322 X |
| 4,923,000 | 5/1990 | Nelson | 165/122 |
| 5,008,582 | 4/1991 | Tanuma et al. | 310/332 |
| 5,151,626 | 9/1992 | Dewhirst | 310/331 |
| 5,192,197 | 3/1993 | Culp | 417/410.2 |
| 5,381,950 | 1/1995 | Aldridge | 236/1 R |
| 5,558,156 | 9/1996 | Tsutsui | 165/84 |

OTHER PUBLICATIONS

"Theory of Air Flow Generation by a Resonant Type PVF$_2$ Bimorph Cantilever Vibrator,"M. Toda, Ferroelectrics, 1979, vol. 22, pp. 911–918, RCA Research Laboratories, Inc., Japan.

Primary Examiner—Mark O. Budd
Attorney, Agent, or Firm—Gary J. Cunningham; Colin M. Raufer

[57] ABSTRACT

A low-profile, axial-flow, single-blade piezoelectric fan is provided. The fan is in the form of a piezoelectric fan assembly (300) which contains a housing (302) defining an axial flow-through internal cavity. Inside the housing (302) is a single fan blade (314) which is attached at only one end to the housing (302). A piezoelectric element (318) is fixedly mounted to the single fan blade (314) and causes the single fan blade (314) to deflect when the piezoelectric element (318) is activated. This piezoelectric fan assembly (300) may be used to cool electronic components in applications where low-power and low-volume fanning is desired.

16 Claims, 3 Drawing Sheets

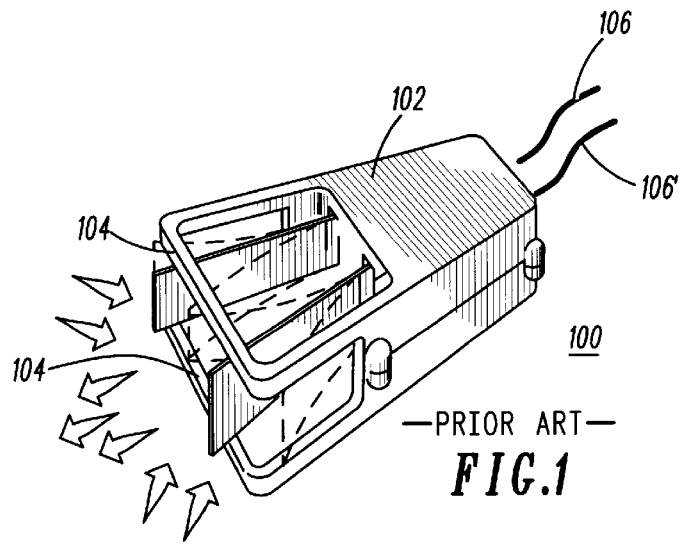
FIG.1 —PRIOR ART—
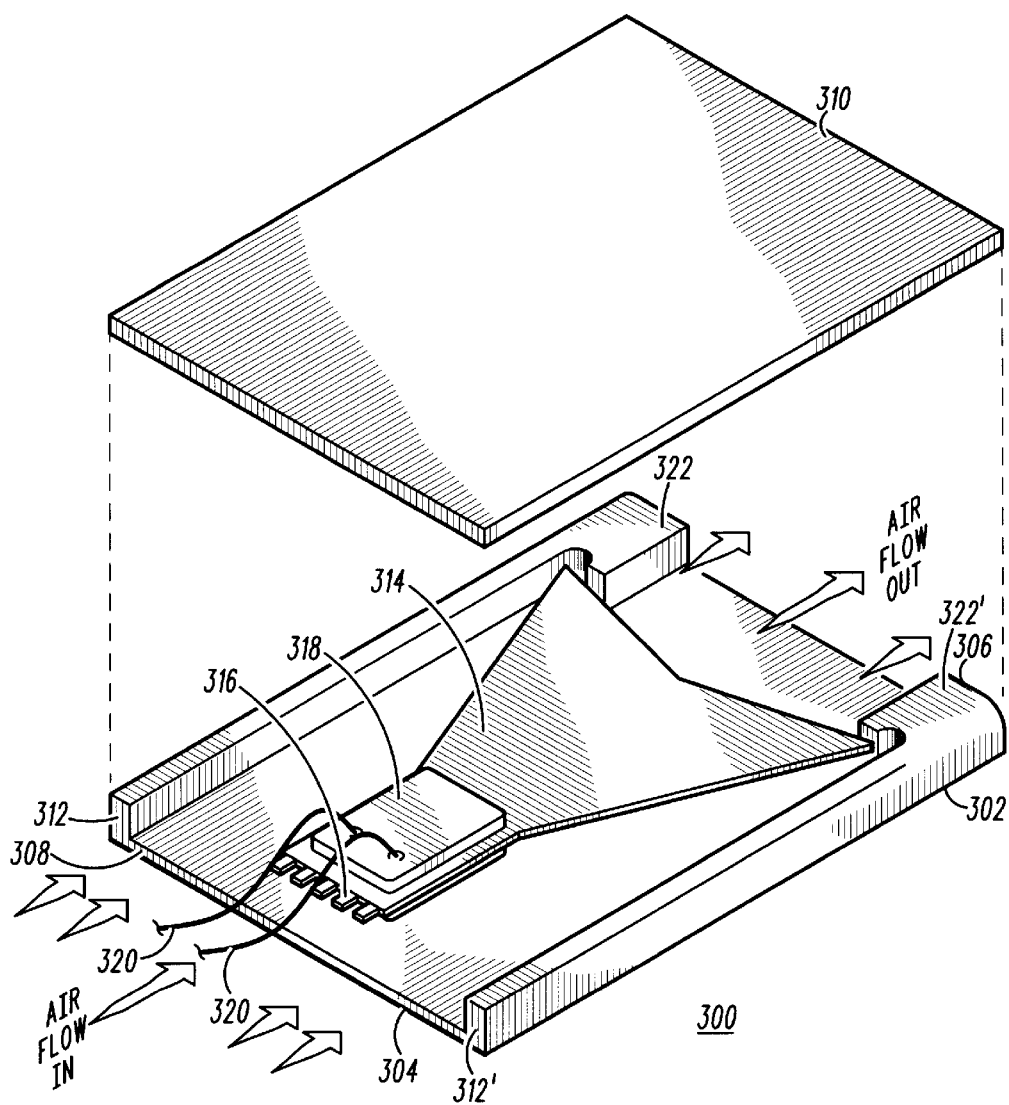
FIG.3

TOP VIEW

SIDE VIEW

BOTTOM VIEW

LOW-PROFILE AXIAL-FLOW SINGLE-BLADE PIEZOELECTRIC FAN

FIELD OF THE INVENTION

This invention relates to piezoelectric fans and, in particular, to a low-profile axial-flow single-blade piezoelectric fan.

BACKGROUND OF THE INVENTION

The use of fans for blowing air over an electronic circuit board for cooling purposes is well known in the art. Typically, this is accomplished using either piezoelectric or rotary type fans.

Rotary type fans have many drawbacks. They require many moving parts including bearings, which necessarily require some type of lubrication. Rotary fans also have typically larger size and power consumption requirements than piezoelectric fans and rotary fans may generate significant electromagnetic interference (EMI) and radio frequency interference (RFI) noise signals. Additionally, rotary fans oftentimes have a shorter life than piezoelectric fans.

Piezoelectric fans have been used as an alternative to rotary fans and offer significant advantages in that they have fewer moving parts, generate very little heat, and can be used in harsh environments with wide temperature ranges, wide humidity ranges, or even in hazardous and explosive gas conditions.

Prior art piezoelectric fans have typically been manufactured using a dual-blade design. The two bender blades are typically oscillated 180 degrees out of phase with each other. The complementary back and forth motion of the two blades provides dynamic balancing and also minimizes vibration and noise in the device. Unfortunately, dual-blade piezoelectric fans have a profile (height above a circuit board) which is unacceptably high for many applications.

FIG. 1 shows a dual-blade piezoelectric fan 100 in accordance with the prior art. In FIG. 1, a housing 102 supports two fan blades 104 and 104' which are driven 180 degrees out of phase with each other. Piezoelectric elements, internal to the housing 102, are activated by a pair of lead wires 106, 106'. The air flow patterns around the blade 104' are represented by arrows which show the air flow in and out of fan 100. Prior art fans, such as the one shown in FIG. 1, have a very high profile and also consume a large volume of space. Although they may be readily used in applications where space restrictions are not an issue, they are ill-suited for cooling densely packed electronic components in modern electronic products.

FIG. 2 shows another embodiment of a flat dual blade piezoelectric fan 200 found in the prior art. Fan 200 contains two fan blades 202, 202' which are separated by a mounting beam 203. Each of the fan blades contains a piezoelectric element 204 which is driven to cause deflection in the fan blades 202, 202'. An electrical current activates the piezoelectric elements and this is shown in FIG. 2 by positive and negative lead wires attached to element 204.

The air flow patterns around the fan blades are represented by arrows which show the air flow in and out of the fan. The primary airflow in occurs at the corners of the fan 206 and the secondary airflow in occurs along the side edges of the fan 208. The air flow out of the fan occurs at an end of the fan 210 opposite the mounting beam 203.

Piezoelectric fan 200 also has significant design drawbacks. The airflow in fan 200 is non-axial and, as such, substantial volume is needed for ducting purposes. Additionally, the height of the dual-blade design may be restrictive for certain applications.

Consequently, a low-profile single-blade piezoelectric fan which offered a low-power, low-noise, low-cost, and low-vibration design and which could provide a sufficient axial flow to cool electronic components in a rugged, customized housing assembly which provided for smaller overall dimensions in electronic products would be considered an improvement in the art.

BRIEF DESCRIPTION OF THE DRAWINGS

FIG. 1 shows a dual-blade piezoelectric fan in accordance with the prior art.

FIG. 3 shows one embodiment of a low-profile axial-flow single-blade piezoelectric fan in accordance with the present invention.

DETAILED DESCRIPTION OF THE PREFERRED EMBODIMENT

Figure 4:
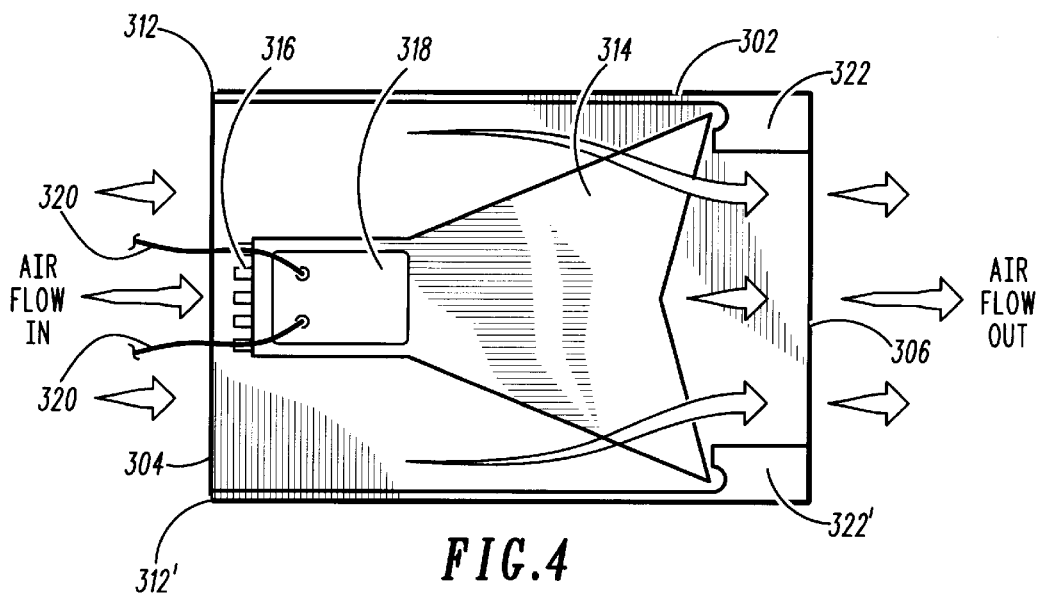
FIG. 4 shows a plan view of the low-profile axial-flow single-blade piezoelectric fan shown in FIG. 3.

FIG. 3 shows one embodiment of a low-profile axial-flow single-blade piezoelectric fan 300. This fan offers the primary advantages of a self-ducting axial air flow design in a low profile package.

Referring to FIG. 3, a piezoelectric fan assembly 300 is provided. Fan 300 contains a substantially hollow and longitudinally extending housing 302 having a proximal end 304 and a distal end 306. The housing 302 includes a base 308, a top blocking cover 310 and a pair of low-profile side walls 312, 312' between the base 308 and the top blocking cover 310. An air input region at the proximal end 304 of the housing 302 and an air output region at the distal end 306 of the housing 302 provide an axial flow of air extending from the air input region to the air output region.

Fan 300 also contains a single fan blade 314 positioned inside the housing 302 and attached to the housing near the air input region by a plurality of vertical mounting posts 316. These mounting posts 316 have a narrow profile to promote the flow of air between the mounting posts 316 from the air input region to the air output region. In one embodiment, the single fan blade 314 comprises a graphite-composite material having a high stiffness-to-mass ratio. The single fan blade 314 may also be tapered depending upon design considerations.

Fan 300 also contains a piezoelectric element 318 fixedly mounted to the single fan blade 314. This may be accomplished with an adhesive material or any other viable mounting technique. The piezoelectric element 318 comprises at least one sheet of piezoelectric ceramic material. When more than one sheet of ceramic is used, the sheets are laminated together under pressure and temperature. The laminated sheets are substantially covered on all external surfaces with a conductive metallization coating (see FIG. 6). A pair of lead wires 320 are then attached to piezoelectric element 318. In one embodiment, lead wires 320 are connected to a drive circuit which activates the piezoelectric element with an alternating current.

Also in FIG. 3, a pair of end blocks 322, 322' are located in the air output region between the sidewalls 312, 312' and a non-attached end of the single fan blade 314. The pair of end blocks 322, 322' help to control the flow of air through the housing 302. The flow of air through the housing 302 is shown by a series of arrows in FIG. 3. Air flow in occurs at the proximal end 304 of the housing and air flow out occurs at the distal end 306 of the housing 302.

Although FIG. 3 shows a detailed drawing of one embodiment of the low-profile, axial-flow, single-blade piezoelectric fan, it should be understood that the only necessary components for the piezoelectric fan assembly are a housing defining an axial flow-through internal cavity, a single fan blade positioned inside the housing and attached at only one end to the housing, a piezoelectric element fixedly mounted to the single fan blade, and a means to activate the piezoelectric element. In a preferred embodiment, the means to activate the piezoelectric element will be a drive circuit.

One specific custom application which would be ideal for a low-profile single-blade piezoelectric fan would be a laptop computer. As a trend in the industry is toward smaller laptop computers which offer higher performance, it becomes difficult to cool the components, processors and circuitry associated with these increasingly complex machines. Localized areas of the laptop computer circuit boards that control advanced graphics and similar systems are known to generate large amounts of heat that must be dissipated to assure reliable operation of the computer. A dual-blade piezoelectric fan design may not be acceptable for this application because of its high profile and lack of axial air flow.

FIG. 4 shows a plan view of the low-profile axial-flow single-blade piezoelectric fan shown in FIG. 3. In FIG. 4, various elements which were shown, labeled, and discussed in FIG. 3 are provided. These elements are incorporated by reference herein to this discussion of FIG. 4. Notably in FIG. 4, the flow of air from the proximal end 304 of the housing 302 to the distal end 306 of the housing is shown. The air flow in and air flow out are shown by a series of arrows in FIG. 4 which show the direction of the air through the housing. Significantly, FIG. 4 clearly shows how the pair of end blocks 322, 322' along with the fan blade 314 cause the air to change its path so that it travels around the end blocks 322, 322'.

Figure 5:
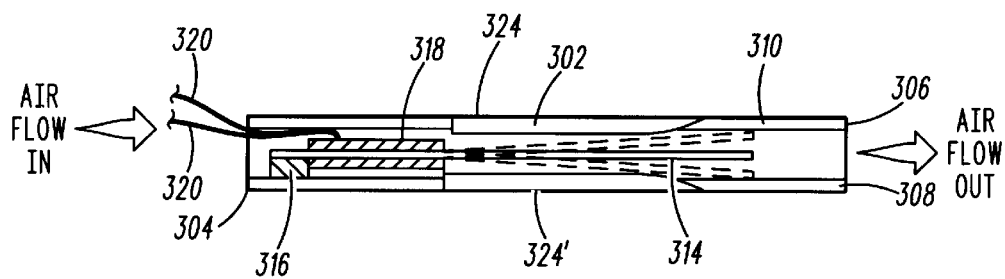
FIG. 5 shows a side view of the low-profile axial-flow single-blade piezoelectric fan shown in FIG. 3 with the addition of blade stop blocks.
Figure 2:
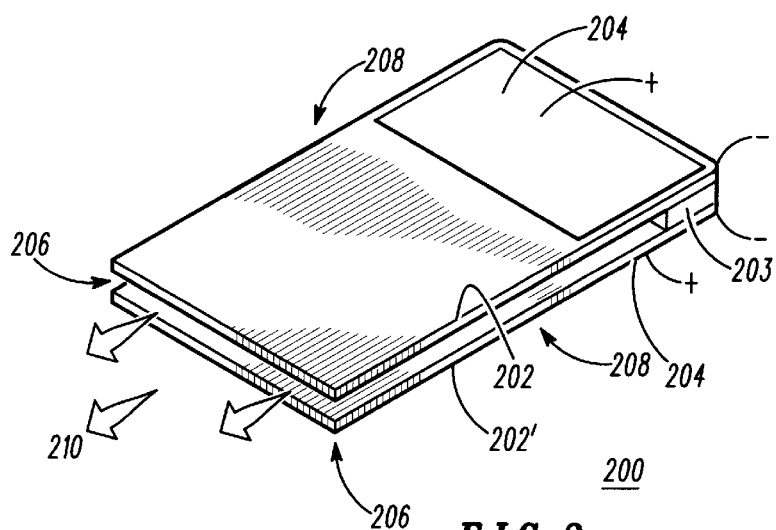
FIG. 2 shows another embodiment of a dual-blade piezoelectric fan in accordance with the prior art.

FIG. 5 shows a side view of the low-profile axial-flow single-blade piezoelectric fan shown in FIG. 3 having blade stop blocks. From this view, the piezoelectric housing 302 showing the proximal end 304 and the distal end 306 as well as the base 308 and the top blocking cover 310 are provided. Inside the housing, the mounting posts 316, the single fan blade 314, the piezoelectric element 318 as well as the lead wires 320 are also provided. The air flow in at the proximal end 304 of the housing 302 and the air flow out at the distal end 306 of the housing is shown by arrows. From this view, the deflection of the single fan blade 314 upon activation of the piezoelectric element 318 is shown as a set of dashed lines both above and below the single fan blade 314. Note that in a preferred embodiment, the housing will be designed such that the single fan blade approaches but never actually touches the base 308 or the top blocking cover 310.

In still another embodiment of the present invention, the housing- may contain blade stop blocks for high-gravity applications which require a controlled peak deflection. Blade stop blocks merely set the travel limits for the blades inside the housing. Blade stop blocks may also provide a support for the blade to eliminate high ceramic tensile stress in high shock environments. A pair of blade stop blocks are shown as 324 and 324' in FIG. 5.

The importance of an axial airflow in the present invention cannot be understated. Axial airflow is important because it eliminates the need for additional ducting to feed blade corner inlets. This allows for higher density packing. Stated another way, the volume of space required to facilitate the air inlet in a piezoelectric fan having an axial flow is substantially less than the volume of space required for a piezoelectric fan having a conventional air flow design. Thus, the amount of real estate in an electronic enclosure dedicated to an axial flow piezoelectric fan is substantially less than a conventional flow piezoelectric fan.

Axial flow is advantageous for applications involving a substantially flat circuit board or electronic component system in a housing assembly that provides little clearance for airflow. In such an environment, a strong axial flow of air generated by a piezoelectric fan may prove capable of venting localized thermal regions on the board and provide efficient transfer of air throughout the entire electronic cabinet. As electronic products are being designed using smaller and lighter components, a low-profile cooling system, in the form of a single-blade piezoelectric fan may meet strict height requirements and be easily integrated into low-profile electronic products. Whereas rotary fans may be made as small as about 20 mm high, a single-blade piezoelectric fan of similar capabilities may be merely about 5 mm high or less.

Traditional vibrating fan designs do not create axial flow. In the present invention, a strong axial flow is an important feature of the fan blade and housing design and these components are designed so as to maximize the axial flow across the piezoelectric fan.

In order to achieve the desired axial air flow, the shape of the housing is an important design consideration. The housing design will be made in conjunction with the fan blade design in order to achieve the desired airflow characteristics. In one embodiment of the present invention, the housing may be directly integrated into an external casing of a laptop computer, for example. In another embodiment of the present invention, the housing may be created from a base, a top blocking cover, and a pair of low-profile sidewalls therebetween.

One major advantage with using a single-blade, as opposed to a dual-blade design, is that the profile of the fan will be only one-half as high. In simple terms, a single-blade fan is only half as high as a dual-blade fan and uses only half as much material. This allows a single-blade fan to be integrated into products and applications where a dual-blade fan in not feasible. One challenge involved in the design of a single-blade piezoelectric fan is that there may be additional vibration as compared with a dual-blade design.

The effects of vibration may be minimized in two ways. The present invention employs both of the techniques described below to minimize vibration. First, by minimizing the moving mass one can significantly reduce the vibration generated. Utilizing high stiffness blade materials allows for thinner, reduced weight blades which still maintain the desired resonant frequency. Moreover, the mass of the ceramic wafer, which forms the piezoelectric element, may be reduced by using a high purity ceramic material which may be sliced into thinner wafer elements which are then attached to the fan blades.

Another method of reducing vibration employed by the present invention involves decoupling the fan mass from the electronic enclosure. This has the effect of reducing the transfer of vibration to the end user. Thus, a mono-blade (also called a single-blade) fan design in which vibration effects have been reduced may be used for many new applications.

In general, the frequency of the oscillation of the fan blade depends upon the magnitude of the input voltage and also upon the length and stiffness of the fan blade. Depending upon design variables, the blades may be driven at any suitable speed such as a frequency from about 20 to about 1000 hertz. The driving frequency is approximately equal to the natural resonant frequency (fundamental frequency) of the blades to optimize fan efficiency.

The relationship between the fan blade design and the means to activate the piezoelectric element (typically a drive circuit) is another important design consideration. In a preferred embodiment, an alternating input voltage will be introduced at a resonant frequency which is tuned to the fan blade design such that a maximum sweep height for the blade can be achieved. Thus, the driving voltage will be one mechanism by which the fan blade displacement may be controlled. In a preferred embodiment, the fan blade will be driven at its own resonant frequency for maximum efficiency.

The piezoelectric fan blade material will be dependent upon the specific environment in which the fan will operate, however, as a general rule, the fan blade will be made from a material having a high stiffness-to-weight ratio and a low mass. A graphite-epoxy material, for example, meets these requirements, and also exhibits anisotropic properties that can render it stiffer in one axis relative to another. Other suitable blade materials include, but are not limited to, steel, aluminum, mylar, or fiberglass. Of course, a lightweight fan may provide reduced vibration and require less power consumption.

The piezoelectric fan blade profile will also be design specific. In a preferred embodiment, the fan blade will be tapered such that one end is wider than another. Typically, the mounted end will be more narrow than the deflecting end of the blade. Additionally, the end of the fan blade may also be tapered to further customize air flow. The thickness of the piezoelectric fan blade may also be dependent upon the specific application, however, it will be desirable that it have the structural integrity so as not to be fragile in its working environment.

Piezoelectric wafers may be connected to the sides of the blades making them piezoelectric monomorphs or bimorphs which are capable of deflecting and bending when a voltage is applied. The prospect of coating the piezoelectric wafers is also within the scope of the present invention. An electrode coating may be applied by any of a number of deposition techniques including spray drying, sputtering, vapor deposition, or other adhesion techniques.

Another important aspect of this invention involves the controlled flow of air through the housing and, more specifically, around the piezoelectric fan blade. Most air flow parameters will be controlled through the use of custom ducting and fan blade designs which will be designed on an application specific basis. Significant variables include the desired flow rate and pressure drop as well as pressure within the flow duct, the ambient temperature, the geometry of the flow duct, the number and location of the piezoelectric fans in the system, as well as a host of other variables.

The flow characteristics for the low-profile axial-flow single-blade piezoelectric fan will be resolved on an application specific basis. The fan blade can be contoured to optimize the flow direction without sacrificing performance which may be measured by parameters such as flow rate and pressure drop.

A significant challenge in the design of a piezoelectric fan involves mounting the piezoelectric element to the fan blade. In order to utilize the piezoelectric effect, there must be intimate contact between the fan blade and the piezoelectric element. According to bender theory and design, it is desirable to transfer the stress from the piezoelectric element to the fan blade in a most efficient manner. As such, in a preferred embodiment, an adhesive having a thin bond line works well for bonding the piezoelectric element to the fan blade. However, it may be possible to use other mounting techniques such as a mechanical mount or other fixturing assembly.

Another important aspect of the present invention involves the use of wrap-around electrodes on the piezoelectric fan blades. This is described in detail in FIG. 6. Employing a wrap around pattern for the piezoelectric wafer electrodes will allow them to be used with both conductive and non-conductive blade materials. Heretofore, piezoelectric fan designs use conductive blade materials in order to make a direct electrical connection to the mounting face electrodes. By incorporating a patterned electrode (as shown in FIG. 6), one can utilize non-conductive materials to meet weight, stiffness, and design performance requirements.

Figure 6A:
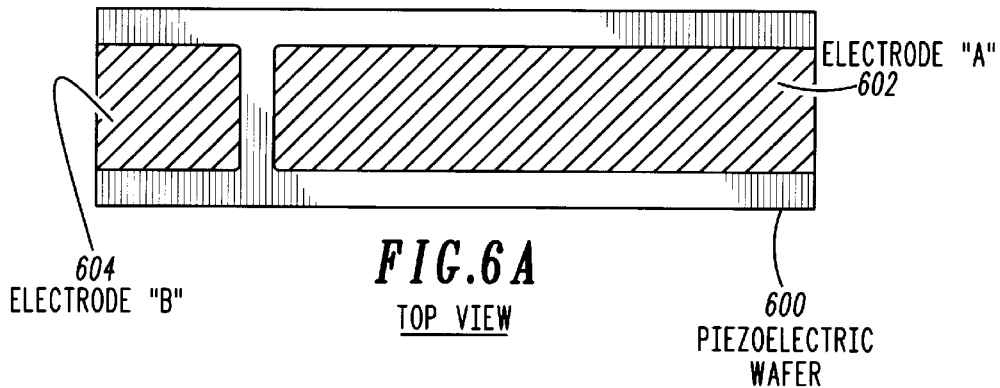
FIGS. 6A–6C show a top, side, and bottom view of a piezoelectric element with a wrap-around electrode design.
Figure 6B:
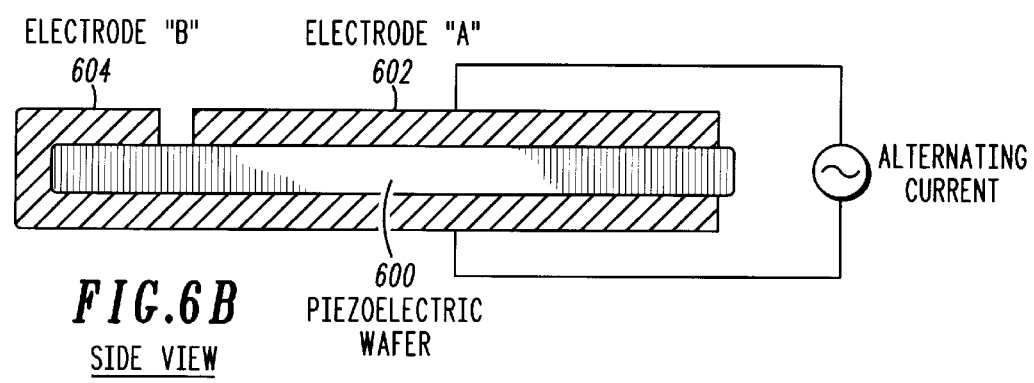
Figure 6C:
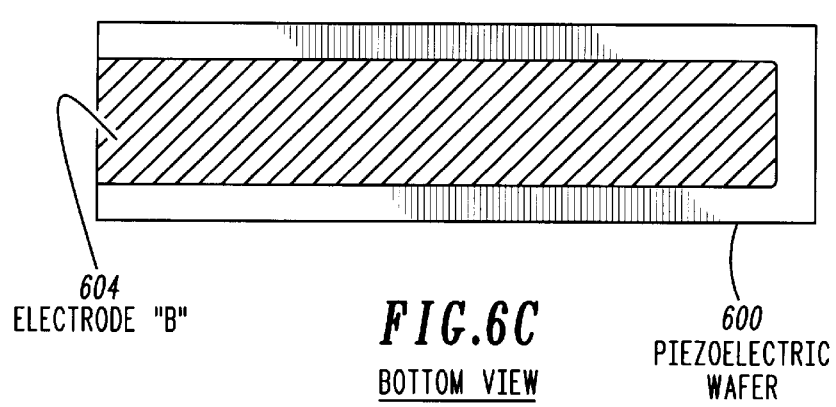

FIGS. 6A–6C show a top, side, and bottom view of a piezoelectric element (piezoelectric wafer electrode) with a wrap-around electrode design. Referring to FIG. 6A, a top view of an electrode patterned coating on piezoelectric wafer 600 is provided. Note that the patterns for both Electrode A (602) and Electrode B (604) can seen from this top view. FIG. 6B shows a side view of piezoelectric wafer 600 having Electrode A (602) on a top surface and Electrode B (604) in a wrap-around configuration. Note that both electrodes are connected to a common alternating source of current. FIG. 6C shows a bottom view of the piezoelectric wafer 600. From this view, the patterning of Electrode B can be seen. Employing a wrap-around pattern for the piezoelectric wafer electrodes will allow them to be used on both conductive and non-conductive fan blade materials.

Another important feature of the present invention, which may be used in certain embodiments, is the introduction of end blocks. End blocks are located in the air output region between the sidewalls and a non-attached end of the single fan blade (322, 322' in FIG. 3). The purpose of the end blocks is to develop axial flow through the housing. The shape of the end blocks will control the exit velocity of the flow out of the housing. Although the end blocks will be custom-designed to meet customer specifications, one embodiment of the present invention will have tapered end blocks to increase the exit velocity of the flow from the housing.

The end blocks also serve the additional purpose of preventing short circuiting. Short circuiting is a term-of-art which describes a situation wherein air no longer travels with true axial flow, but rather creates small circular patterns instead. This decreases the overall operating efficiency of the piezoelectric fan and reduces the maximum mass transfer. Thus, the end blocks serve a very useful and necessary design feature and may be customized to for specific applications.

The piezoelectric fan of the present invention is scaleable depending upon the size and flow requirements of a specific application. Whereas one embodiment contemplates a miniature fan blade cooling a very small confined area, perhaps even a single electronic component. Another embodiment may be a design for a large fan blade and housing designed to cool a large enclosure which requires using a substantial amount of power.

Although various embodiments of this invention have been shown and described, it should be understood that various modifications and substitutions, as well as rearrangements and combinations of the preceding embodiments, can be made by those skilled in the art, without departing from the novel spirit and scope of this invention.

What is claimed is:

1. A piezoelectric fan assembly, comprising:
   a housing defining an axial flow-through internal cavity;
   a single fan blade positioned inside the housing and attached at one end to the housing, and wherein the fan blade has an unmounted end and a mounted end and has a tapered edge such that the fan blade is wider at the unmounted end than it is at the mounted end;
   a piezoelectric element fixedly mounted to the single fan blade; and
   means to activate the piezoelectric element.

2. The piezoelectric fan of claim 1, wherein the fan blade is a graphite-epoxy material having a high stiffness to weight ratio and a low mass.

3. The piezoelectric fan of claim 1, wherein the housing has a total height of about 0.200 inches or less.

4. The piezoelectric fan of claim 1, wherein the means for activating the piezoelectric element comprises a driving circuit which can operate at a frequency of about 20 to about 1000 hertz.

5. The piezoelectric fan of claim 1, wherein the piezoelectric element has an external surface and contains a metallization pattern on the exterior surface to allow for electrical connections on a non-conductive piezoelectric fan blade.

6. The piezoelectric fan of claim 1, wherein the housing is directly integrated into an external casing of a laptop computer.

7. The piezoelectric fan of claim 1, wherein the piezoelectric element has a wrap-around electrode design.

8. The piezoelectric fan of claim 1, wherein the end blocks are incorporated to eliminate air short circuiting and to tune exit air velocity.

9. The piezoelectric fan of claim 1, wherein the piezoelectric element is mechanically mounted to the fan blade.

10. The piezoelectric fan of claim 1, wherein the housing contains blade stop blocks.

11. A piezoelectric fan assembly, comprising:
    a substantially hollow and longitudinally extending housing having a proximal end and a distal end, the housing including a base, a top blocking cover and a pair of low-profile side walls between the base and the top blocking cover and an air input region at the proximal end of the housing and an air output region at the distal end of the housing and providing an axial flow of air extending from the air input region to the air output region;
    a single fan blade positioned inside the housing and attached to the housing near the air input region by a plurality of vertical mounting posts, the single fan blade comprising graphite-composite material having a high stiffness-to-mass ratio, the fan blade having a taper on an edge near the side wall;
    a piezoelectric element fixedly mounted to the single fan blade with an adhesive material, the piezoelectric element comprising at least one sheet of piezoelectric ceramic material, the sheet substantially covered on all external surfaces with a conductive metallization coating, the piezoelectric element having a pair of electrodes with lead wires on a major surface;
    a pair of end blocks in the air output region between the sidewalls and a non-attached end of the single fan blade to control flow through the housing; and
    a drive circuit to activate the piezoelectric element with an alternating current.

12. The piezoelectric fan of claim 11, wherein the housing has a total height of about 0.200 inches or less.

13. The piezoelectric fan of claim 11, wherein the drive circuit which can operate at a frequency of about 20 to about 1000 hertz.

14. The piezoelectric fan of claim 11, wherein the piezoelectric element has a wrap-around electrode design.

15. The piezoelectric fan of claim 11, wherein the end blocks are incorporated to eliminate air short circuiting and to tune exit air velocity.

16. The piezoelectric fan of claim 11, wherein the housing contains blade stop blocks.

* * * * *